(12) United States Patent
Liu

(10) Patent No.: US 7,397,284 B1
(45) Date of Patent: Jul. 8, 2008

(54) BOOTSTRAPPED CIRCUIT

(75) Inventor: Peng Liu, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 11/732,600

(22) Filed: Apr. 3, 2007

(51) Int. Cl.
*H03K 19/094* (2006.01)
*H03K 19/0175* (2006.01)
*H03K 19/082* (2006.01)

(52) U.S. Cl. .............................. 326/88; 326/92; 326/82; 327/390

(58) Field of Classification Search .................... 326/80, 326/83, 88, 92
See application file for complete search history.

(56) References Cited

U.S. PATENT DOCUMENTS 7,253,675 B2 *  8/2007  Aksin et al. ................. 327/390
2006/0017466 A1 *  1/2006  Bryson ........................ 326/88
2006/0202735 A1 *  9/2006  Aksin et al. ................. 327/390
2007/0046359 A1 *  3/2007  Zanchi et al. ................ 327/390

OTHER PUBLICATIONS

Abo, Andrew Masami,, "Design for Reliability of Low-voltage Switched-capacitor Circuits", Spring 1999, (142 pgs. ) Graduate Division , UC Berkeley, http://kabuki.eecs.berkeley.edu/~abo/abothesis.pdf.

* cited by examiner

*Primary Examiner*—Rexford Barnie
*Assistant Examiner*—Dylan White
(74) *Attorney, Agent, or Firm*—Kin-Wah Tong

(57) ABSTRACT

A bootstrapping circuit capable of sampling input signals beyond a supply voltage is disclosed. In one embodiment, the bootstrapped circuit is implemented having a reduced area and/or power consumption requirement.

17 Claims, 4 Drawing Sheets

200

BOOTSTRAPPED CIRCUIT

FIELD OF THE INVENTION

One or more aspects of the present invention relate generally to electronic circuitry and, in particular, to a bootstrapped circuit or switch having a reduced area and/or power consumption requirement.

BACKGROUND OF THE INVENTION

Generally, integrated power management applications may require the ability to sample and measure voltage from the surroundings. For example, integrated power management applications may employ a low power successive approximation register (SAR) analog-to-digital converter (ADC) to monitor on-chip and off-chip voltage quantities. Such ADCs often employ a bootstrapped circuit in a track and hold circuit having a plurality of capacitors. In fact, DC to DC converter applications may also employ such bootstrapped circuits. Unfortunately, the capacitors in the bootstrapped circuit require a certain amount of physical space and consume power. Accordingly, there exists a need in the art for a bootstrapped circuit having a reduced area and/or power consumption requirement.

SUMMARY OF THE INVENTION

In one embodiment, a bootstrapping circuit is disclosed. For example, the bootstrapping circuit comprises: a first transistor coupled between an input node and an output node, wherein a gate of said first transistor is coupled to a first control node; a second transistor having a first end coupled to said first control node, wherein said a second end of second transistor is coupled to a second control node; a capacitor having a first end coupled to said second control node, wherein a second end of said capacitor is coupled to a third control node; a first switching circuit, coupled to said first control node for connecting a ground node to said first control node; a third transistor having a first end coupled to said input node, wherein a gate of said third transistor is coupled to said first control node, and wherein a second end of said third transistor is coupled to said third control node; a second switching circuit, coupled to said second transistor for controlling said second transistor, wherein said second switching circuit is coupled to a first clock node; a fourth transistor having a first end coupled to said third control node, wherein a gate of said fourth transistor is coupled to a second clock node, and wherein a second end of said fourth transistor is coupled to said ground node; a fifth transistor having a first end coupled to said second control node, wherein a gate of said fifth transistor is coupled to a fourth control node, and wherein a second end of said fifth transistor is coupled to a source node; a sixth transistor having a first end coupled to said fourth control node, wherein a gate of said sixth transistor is coupled to said source node, and wherein a second end of said sixth transistor is coupled to said first clock node; and a seventh transistor having a first end coupled to said fourth control node, and wherein a second end of said seventh transistor is coupled to said second control node.

In another embodiment, the bootstrapping circuit comprises: a first transistor coupled between an input node and an output node, wherein a gate of said first transistor is coupled to a first control node; a second transistor having a first end coupled to said first control node, wherein a second end of said second transistor is coupled to a second control node; a capacitor having a first end coupled to said second control node, wherein a second end of said capacitor is coupled to a third control node; a first switching circuit, coupled to said first control node for connecting a ground node to said first control node; a third transistor having a first end coupled to said input node, wherein a gate of said third transistor is coupled to said first control node, and wherein a second end of said third transistor is coupled to said third control node; a second switching circuit, coupled to said second transistor for controlling said second transistor, wherein said second switching circuit is coupled to a first clock node; a fourth transistor having a first end coupled to said third control node, wherein a gate of said fourth transistor is coupled to a second clock node, and wherein a second end of said fourth transistor is coupled to said ground node; and a fifth transistor having a first end coupled to said second control node, wherein a gate of said fifth transistor is coupled to said first control node, and wherein a second end of said fifth transistor is coupled to a source node.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
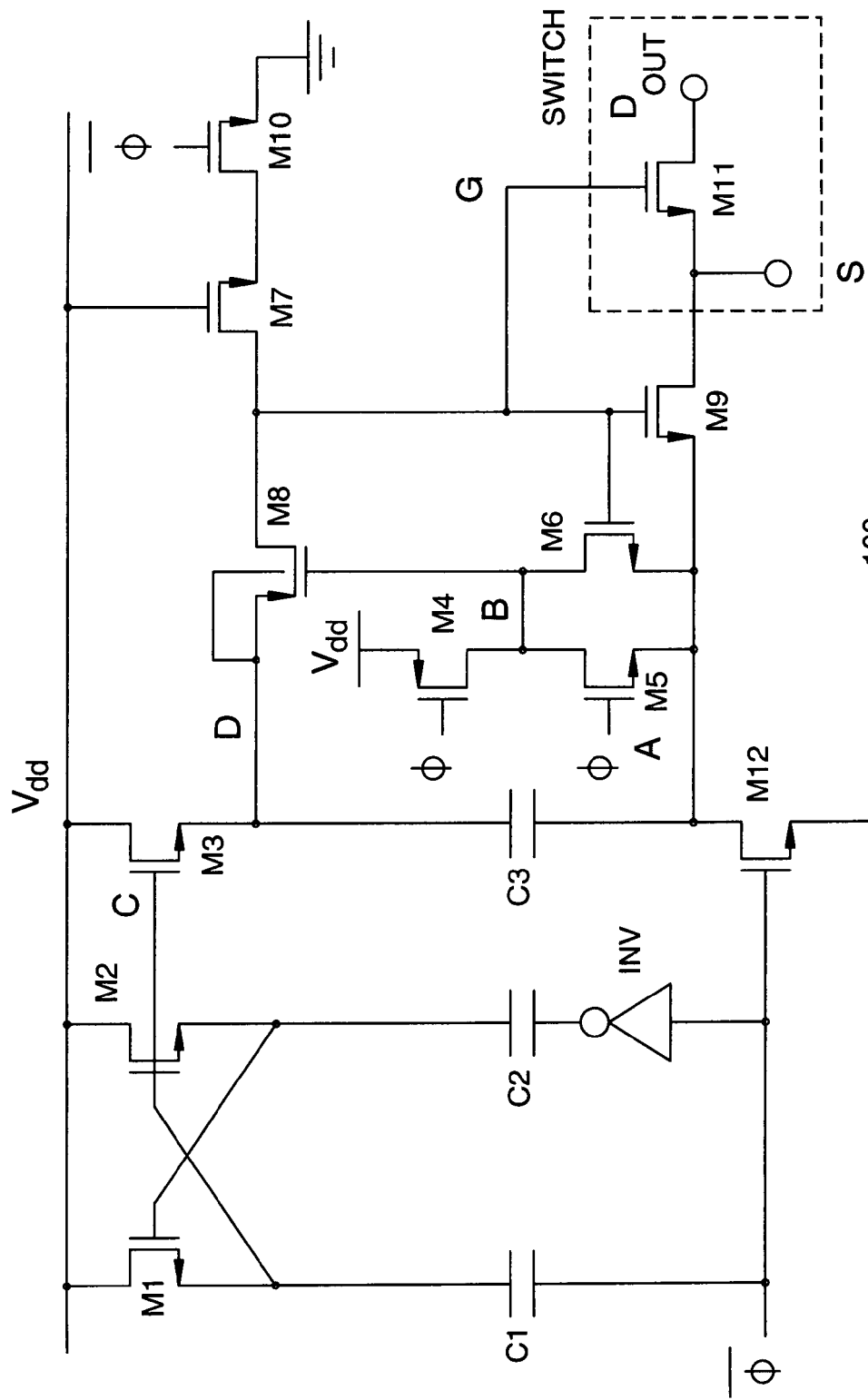
FIG. 1 illustrates a circuit diagram of a prior art bootstrap circuit.

FIG. 1 illustrates a conventional bootstrapped switch or circuit 100. The bootstrapped circuit comprises transistors M1-M12, capacitors C1-C3, inverter INV, clock signal nodes $\phi$ and $\bar{\phi}$, input node S, output node $D_{out}$, and a source node for providing a source voltage Vdd. The NMOS transistor M11 (also known as the main switch) connected to the input and output nodes is the switch that is performing the sampling of the input signal. The sampling is accomplished using a capacitor (not shown) that is connected between the terminal D and ground.

To illustrate, the transistors M1, M2, the capacitors C1, C2, and the inverter INV form a charge pump. Initially, the voltage across the capacitors C1 and C2 is at zero. When the clock signal $\bar{\phi}$ turns high, the top plate of capacitor C1 goes to the supply voltage Vdd. Furthermore, since the bottom plates of capacitors C2 and C3 are grounded, those capacitors are charged till their top plates reach voltage Vdd-Vth (where Vth is the threshold voltage for the transistors M2 and M3). Subsequently, when the clock signal $\bar{\phi}$ turns low, the top plate of capacitor C2 is pushed higher than voltage Vdd (e.g., just below 2 Vdd), thereby completing the charging of capacitor C1 to Vdd through the switch M1.

When $\bar{\phi}$ turns high again, since capacitor C1 is charged to Vdd, the top plate of capacitor C1 will rise to 2 Vdd and capacitors C2 and C3 will be charged to Vdd. Thus, in the steady state, capacitors C1, C2, and C3 will be charged to Vdd and the voltage on the top plates of capacitors C1 and C2 will oscillate between Vdd and 2 Vdd.

The bootstrapped switch operates as follows. When $\bar{\phi}$ turns high, the top plate of capacitor C1 goes to 2Vdd so switch M3 turns on. Thus, capacitor C3 is charged to Vdd. Switch M4 is also turned on, thereby driving the gate of transistor M8 to Vdd. Thus, transistor M8 is turned off. Transistor M10 is turned on and grounds the gate terminal of the transistor M11. Since their gate terminal is grounded, transistors M6, M9, and M11 are turned off. During this stage, the switch M11 disconnects the input node S from the output node $D_{out}$ and charges capacitor C3 to Vdd.

When $\bar{\phi}$ turns low, since transistor M10 is turned off, the gate terminal of M11 becomes high impedance. Initially, the bottom plate of capacitor C3 is floating, but because of the fact that switch M5 connects capacitor C3 between the gate and source terminal of transistor M8, this transistor turns on immediately and the charge stored on capacitor C3 starts flowing to the gate terminal of transistor M11. In other words, when transistor M5 is turned on, it will pull the gate voltage of transistor M8 down to the voltage of bottom plate of C3, due to the fact that the value of C3 is much greater than the gate capacitance of M8. Therefore transistor M8 is turned on because the Vgs of transistor M8 is equal to Vdd. Since the value of C3 is much greater than the sum of the gate capacitance and the parasitic capacitance of M6, M9 and M11, the gate voltage of M11 will start from Vdd. While the gate voltage of transistor M11 rises, transistor M9 turns on and forces the bottom plate of capacitor C3 towards the input voltage Vs, which pushes the top plate of capacitor C3 to voltage Vdd+Vs. This voltage will appear at the gate of transistor M11, thereby causing transistor M11 to turn on to connect the input terminal S to the output terminal $D_{out}$. Furthermore, transistor M9 turns on to connect input terminal S to the bottom terminal capacitor C3 and transistor M6 turns on to drive the gate of transistor M8 to the input voltage level. At this stage, the gate-to-source voltages of all four transistors M11, M9, M8 and M6, are all equal to Vdd. Thus, the transistor M11 can be turned on.

Although the conventional bootstrapped switch or circuit 100 is effective in certain applications, its use of three capacitors requires a substantial amount of physical space and consumes power. Furthermore, it is somewhat limited in its ability to sample input voltages that are greater than the supply voltage. In other words, it is because the gate voltage of M3 is operating in the range of [vdd,2 vdd], so if the input signal is greater than Vdd, then node D will be greater than 2 Vdd, thereby causing the loss of switching control of transistor M3.

Figure 2:
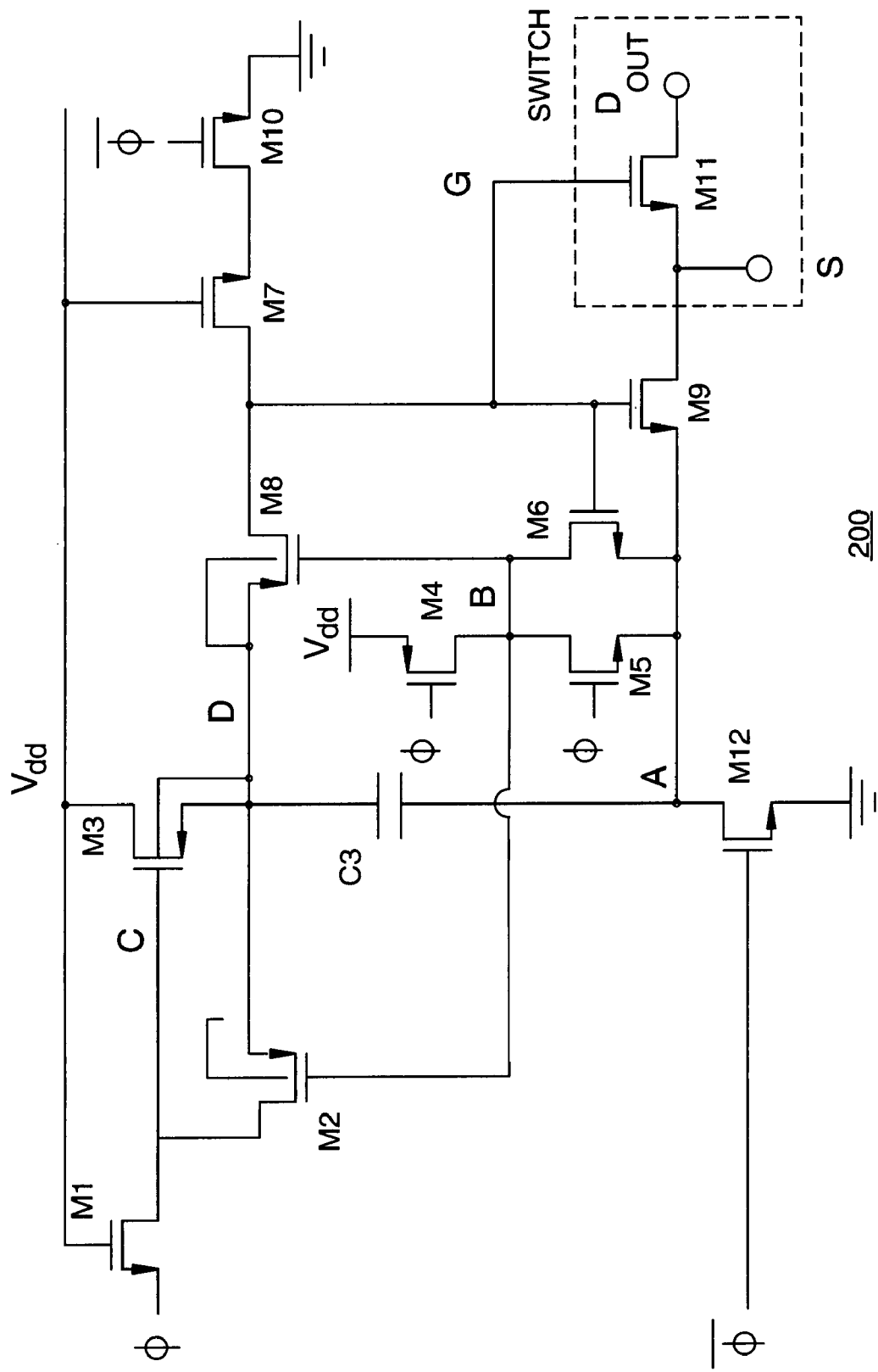
FIG. 2 illustrates a circuit diagram of a bootstrapping circuit according to an embodiment of the present invention.

FIG. 2 illustrates a circuit diagram of a bootstrapping circuit 200 according to an embodiment of the present invention. It should be noted that a portion of the bootstrapping circuit 200 of FIG. 2 is similar to the bootstrapping circuit 100 of FIG. 1 and this similar portion may operate in a similar manner.

Unlike the conventional bootstrapping circuit 100, the present bootstrapping circuit 200 avoids the need to deploy capacitors C1 and C2, and the inverter INV, thereby saving physical space and reducing power consumption. Furthermore, the configuration of transistors M1, M2, and M3 have also changed. To assist in the understanding of the present bootstrapping circuit 200, Table 1 below provides a summary of the states of the transistors and various nodes of the present bootstrapping circuit 200.

It should be noted that each of the "nodes" of the present bootstrapping circuit can be broadly interpreted as a control node for one or more transistors in the present bootstrapping circuit. Furthermore, each transistor is broadly defined as having two ends (e.g., a source and a drain) and a gate. In one embodiment, the gate of one or more transistors can be coupled to one of the control nodes.

TABLE 1

| ø | A | B | C | D | G | M1 | M2 | M3 | M4 | M5 | M6 | M7 | M8 | M9 | M10 | M11 | M12 |
|---|---|---|---|---|---|----|----|----|----|----|----|----|----|----|-----|-----|-----|
| 0 | 0 | Vdd | 0 | Vdd | 0 | on | off | on | on | off | off | on | off | off | on | off | on |
| 1 | Vs | Vs | Vdd + Vs | Vdd + Vs | Vdd + Vs | off | on | off | off | on | on | off | on | on | off | on | off |

Referring to FIG. 2, the present bootstrapping circuit 200 operates as follows. If the clock signal is low (e.g., 0 volt), the transistor M12 (e.g., a NMOS transistor) is turned on, thereby causing node A to be grounded. Furthermore, transistor M4 (e.g., a PMOS transistor) is turned on and transistor M5 (e.g., a NMOS transistor) is turned off, thereby causing node B to rise to Vdd. Hence, M2 (e.g., a PMOS transistor) is turned off. Additionally, transistor M1 (e.g., a NMOS transistor) is turned on therefore, M3 (e.g., a PMOS transistor) is turned on, thereby causing node C to fall to 0 and node D to reach Vdd. Additionally, transistors M10 (e.g., a NMOS transistor) and M7 (e.g., a NMOS transistor) are turned on, and transistor M8 (e.g., a PMOS transistor) is turned off, thereby causing node G to be grounded. In turn, transistors M6 (e.g., a NMOS transistor), M9 (e.g., a NMOS transistor) and M11 (e.g., a NMOS transistor), also known as the main switch are turned off, thereby causing bootstrapping circuit 200 to operate at the "hold" mode, i.e., where the input signal at input node S is not being sampled.

If the clock signal is then turned to high (e.g., 1 volt or Vdd), the transistor M12 is turned off, thereby causing node A to rise to a voltage equal to a voltage, Vs, of the input signal at input terminal S. Furthermore, transistor M4 is turned off and transistor M5 is turned on, thereby causing node B to match the voltage of node A. Hence transistor M2 is turned on. Additionally, transistor M1 is turned off, therefore M3 is off, thereby causing both nodes C and D to rise to Vdd+Vs. Additionally, transistors M10 and M7 are turned off, and transistor M8 is turned on, thereby causing node G to rise to Vdd+Vs. In turn, transistors M6, M9 and M11 (the main switch) are turned on, thereby causing bootstrapping circuit 200 to operate at the "track" mode, i.e., where the input signal at input node S is being sampled. Thus, the bootstrapping circuit 200 can be operated to sample the input signal in accordance with the clock signal ø.

It should be noted that the bootstrapping circuit 200 is able to achieve the same function of the conventional bootstrapping circuit 100 without the need of the capacitors C1 and C2 and the inverter INV. This novel approach will significantly save physical space and will reduce power consumption. Furthermore, it should be noted that the present invention also provides the capability of handling a dynamic range of input voltages that are greater than the supply voltage. In other words, the present invention can sample input signal having voltages greater than Vdd. This feature can be realized because transistor M3 can be operated by voltages of Vdd+Vs.

Figure 3:
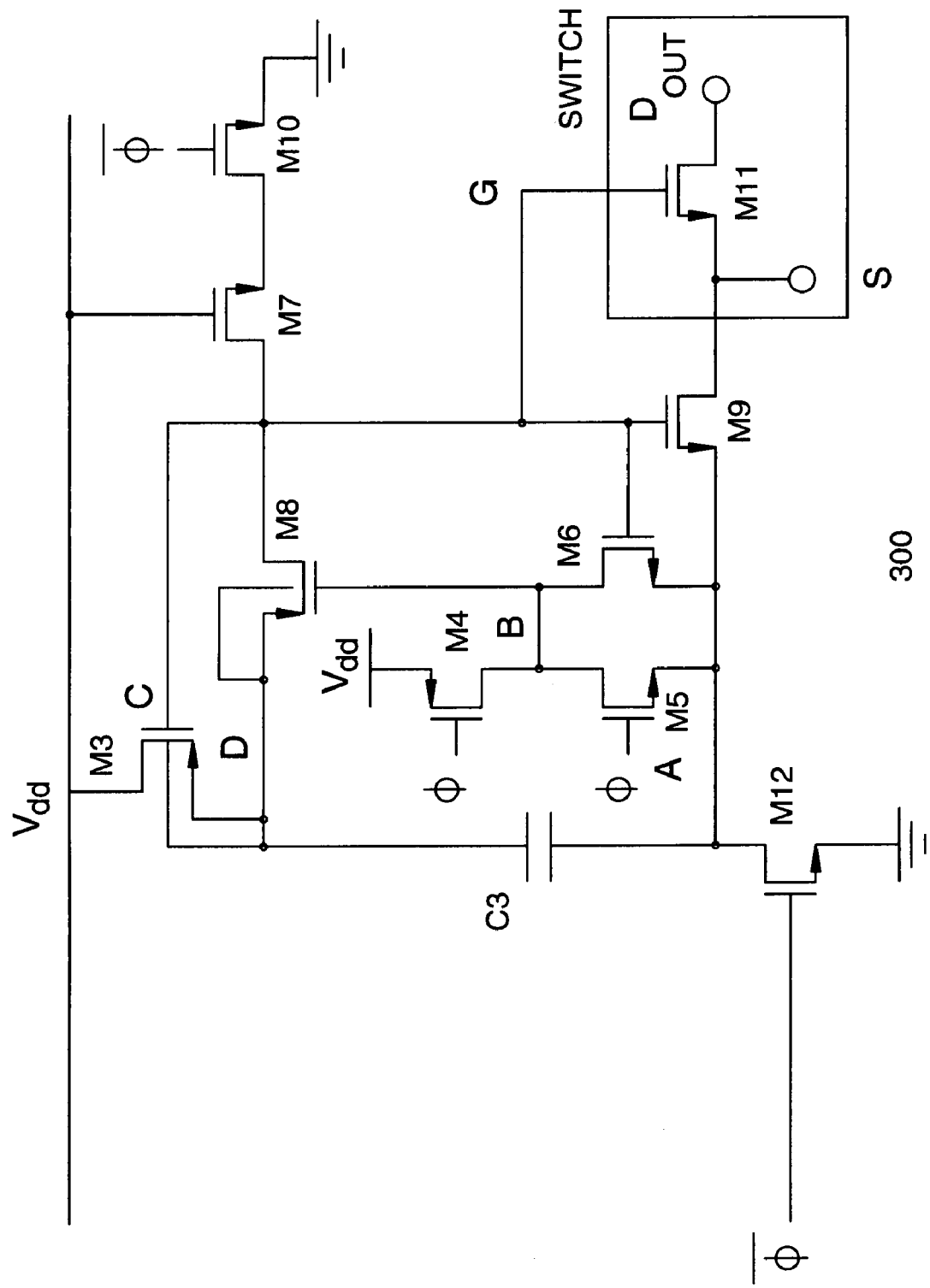
FIG. 3 illustrates a circuit diagram of a bootstrapping circuit according to an embodiment of the present invention.

FIG. 3 illustrates a circuit diagram of a bootstrapping circuit 300 according to an embodiment of the present invention. It should be noted that a portion of the bootstrapping circuit 300 of FIG. 3 is similar to the bootstrapping circuit 100 of FIG. 1 and the bootstrapping circuit 200 of FIG. 2 and this similar portion may operate in a similar manner.

Unlike the conventional bootstrapping circuit 100, the present bootstrapping circuit 300 avoids the need to deploy capacitors C1 and C2, the inverter INV and transistors M1 and M2, thereby further saving physical space and reducing power consumption. Furthermore, the configuration of transistor M3 has also changed. To assist in the understanding of the present bootstrapping circuit 300, Table 1 above provides a summary of the states of the transistors and various nodes of the present bootstrapping circuit 300. Namely, Table 1 is equally applicable to the present bootstrapping circuit 300 with the exception that transistors M1 and M2 are omitted.

Referring to FIG. 3, the present bootstrapping circuit 300 operates as follows. If the clock signal is low (e.g., 0 volt), the transistor M12 (e.g., a NMOS transistor) is turned on, thereby causing node A to be grounded. Furthermore, transistor M4 (e.g., a PMOS transistor) is turned on and transistor M5 (e.g., a NMOS transistor) is turned off, thereby causing node B to rise to Vdd. Additionally, transistors M10 (e.g., a NMOS transistor) and M7 (e.g., a NMOS transistor) are turned on, and transistor M8 (e.g., a PMOS transistor) is turned off, thereby causing nodes C and G to be grounded. Hence, transistor M3 (e.g., a PMOS transistor) is turned on, thereby causing node D to reach Vdd. In turn, transistors M6 (e.g., a NMOS transistor), M9 (e.g., a NMOS transistor) and M11, the main switch, (e.g., a NMOS transistor) are turned off, thereby causing bootstrapping circuit 300 to operate at the "hold" mode, i.e., where the input signal at input node S is not being sampled.

If the clock signal is then turned to high (e.g., 1 volt or Vdd), the transistor M12 is turned off, thereby causing node A to rise to a voltage equal to a voltage, Vs, of the input signal at input terminal S. Furthermore, transistor M4 is turned off and transistor M5 is turned on, thereby causing node B to match the voltage of node A. Additionally, transistors M10 and M7 are turned off, and transistor M8 is turned on, thereby causing nodes C and G to rise to Vdd+Vs. Hence, transistor M3 is turned off, thereby causing node D to rise to Vdd+Vs. In turn, transistors M6, M9 and M11 (the main switch) are turned on, thereby causing bootstrapping circuit 300 to operate at the "track" mode, i.e., where the input signal at input node S is being sampled. Thus, the bootstrapping circuit 300 can be operated to sample the input signal in accordance with the clock signal ø. It should be noted that in this embodiment, nodes C and G are actually the same node.

It should be noted that although FIGS. 2 and 3 are provided with specific layouts of various components, various portions of FIGS. 2 and 3 can be collectively grouped into one or more circuits. For example, transistors M7 and M10 may collectively form a switching circuit or a switch (e.g., a first switching circuit) for controlling the connection of the gate of switch M11 to ground. It should be noted that the use of two transistors instead of a single transistor in the first switching circuit is to improve reliability. Similarly, transistors M4, M5, and M6 may collectively form a switching circuit or a switch (e.g., a second switching circuit) for controlling the operation of transistor M8. As such, those skilled in the art will realize that the implementations of the present bootstrapped circuit as shown in FIGS. 2 and 3 can be adapted in a slightly different way, e.g., by replacing these switching circuits with other switching circuits, while still practicing the present invention.

Figure 4:
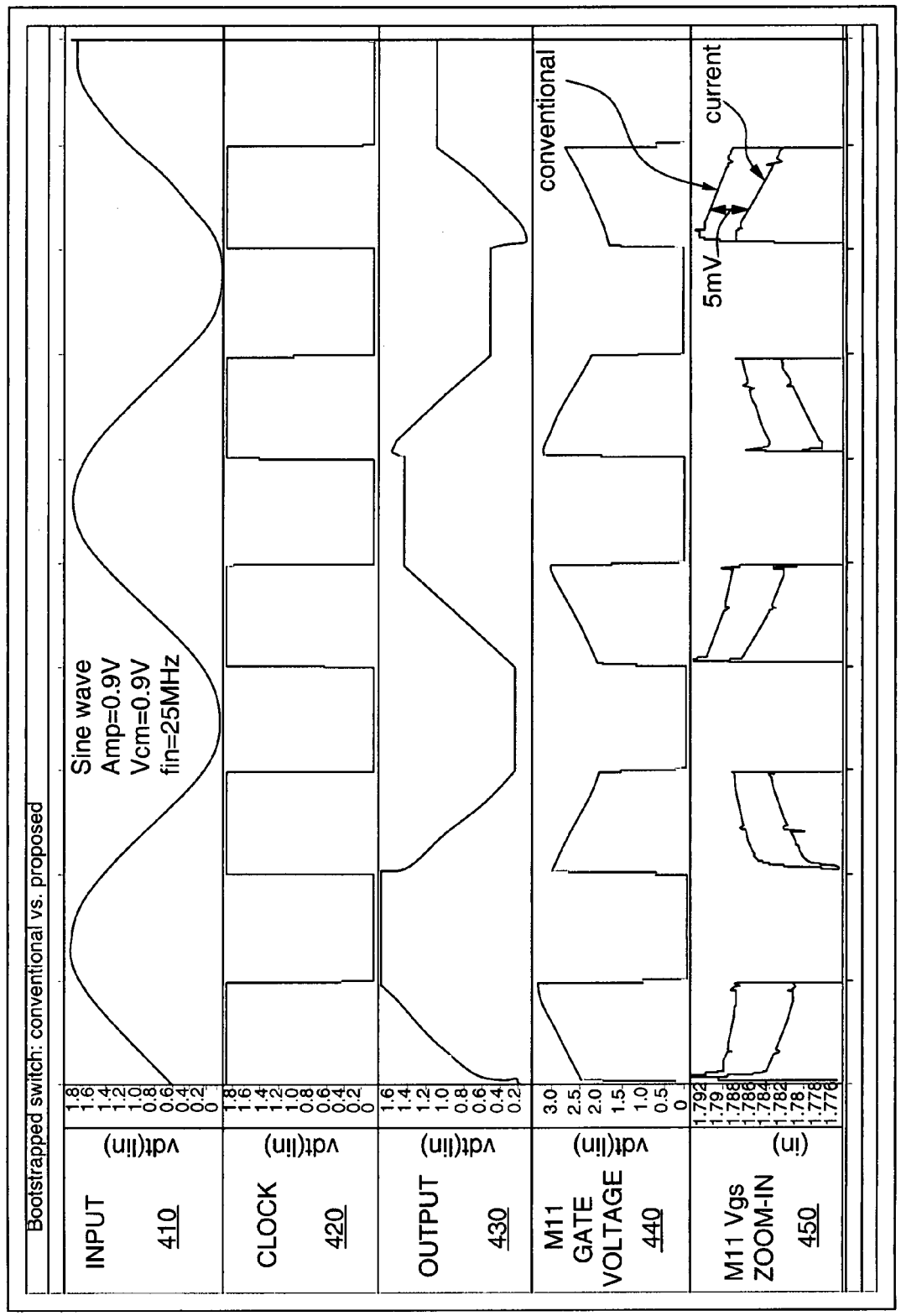
FIG. 4 illustrates a simulation of the present bootstrapping circuit.

FIG. 4 illustrates a simulation 400 of the present bootstrapping circuit. More specifically, FIG. 4 illustrates a series of waveforms 410-450 that compare the performance of the present bootstrapping circuit versus a conventional bootstrapping circuit.

In FIG. 4, waveform 410 illustrates an input voltage signal, e.g., a sine wave. For example, input voltage signal is received at input terminal S of FIG. 2. Waveform 420 illustrates a clock signal ø that is used to sample the input voltage signal 420. For example, when the clock signal ø is set to high, it will cause the present bootstrapping circuit to perform a track function, whereas if the clock signal ø is set to low, it will cause the present bootstrapping circuit to perform a hold function.

Waveform 430 illustrates an output voltage signal, e.g., outputted at output terminal $D_{out}$ of FIG. 2. It should be noted that waveform 430 illustrates the input signal being sampled and held in accordance with the clock signal 420. It has been observed that this output waveform 430 is very similar to an output waveform as produced by the bootstrapped circuit of FIG. 1 using the same input waveform Waveform 440 illustrates the transistor M11's gate voltage. Waveform 450 illustrates the gate to source voltage, Vgs, of transistor M11. It should be noted that waveform 450 illustrates a difference (e.g., 5 mV) of the Vgs between the present invention and the conventional bootstrapping circuit. Furthermore, it illustrates that the present bootstrapping circuit is able to maintain Vgs relatively constant, i.e., presenting a constant switch resistance. It should be noted that Vdd is 1.8V in the simulation as shown in FIG. 4. It should be noted that Vgs of M11 is substantially constant (e.g., 1.79V) and is very close to Vdd which is desirable.

It should be noted that the term "transistor" should be broadly interpreted as a switching means and the term "capacitor" should be broadly interpreted as a charge storing means. As such, although the present invention is disclosed above in terms of transistors and capacitors, those skilled in the art will realize that these devices can be replaced with other devices performing similar functions.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A bootstrapping circuit, comprising:
   a first transistor coupled between an input node and an output node, wherein a gate of said first transistor is coupled to a first control node;
   a second transistor having a first end coupled to said first control node, wherein a second end of said second transistor is coupled to a second control node;
   a capacitor having a first end coupled to said second control node, wherein a second end of said capacitor is coupled to a third control node;
   a first switching circuit, coupled to said first control node for connecting a ground node to said first control node;
   a third transistor having a first end coupled to said input node, wherein a gate of said third transistor is coupled to said first control node, and wherein a second end of said third transistor is coupled to said third control node;
   a second switching circuit, coupled to said second transistor for controlling said second transistor, wherein said second switching circuit is coupled to a first clock node;
   a fourth transistor having a first end coupled to said third control node, wherein a gate of said fourth transistor is coupled to a second clock node, and wherein a second end of said fourth transistor is coupled to said ground node;

a fifth transistor having a first end coupled to said second control node, wherein a gate of said fifth transistor is coupled to a fourth control node, and wherein a second end of said fifth transistor is coupled to a source node;

a sixth transistor having a first end coupled to said fourth control node, wherein a gate of said sixth transistor is coupled to said source node, and wherein a second end of said sixth transistor is coupled to said first clock node; and a seventh transistor having a first end coupled to said fourth control node, and wherein a second end of said seventh transistor is coupled to said second control node.

2. The bootstrapping circuit of claim 1, wherein said first switching circuit comprises:

an eighth transistor having a first end coupled to said first control node, wherein a gate of said eighth transistor is coupled to said source node; and a ninth transistor having a first end coupled to a second end of said eighth transistor, wherein a gate of said ninth transistor is coupled to said second clock node, and wherein a second end of said ninth transistor is coupled to said ground node.

3. The bootstrapping circuit of claim 2, wherein said second switching circuit comprises:

a tenth transistor having a first end coupled to said third control node, wherein a gate of said tenth transistor is coupled to said first control node, and wherein a second end of said tenth transistor is coupled to a fifth control node;

an eleventh transistor having a first end coupled to said third control node, wherein a gate of said eleventh transistor is coupled to said first clock node, and wherein a second end of said eleventh transistor is coupled to said fifth control node;

a twelfth transistor having a first end coupled to said fifth control node, wherein a gate of said twelfth transistor is coupled to said first clock node, and wherein a second end of said twelfth transistor is coupled to said source node; and wherein a gate of said seventh transistor is coupled to said fifth control node.

4. The bootstrapping circuit of claim 3, wherein said first transistor, said third transistor, said fourth transistor, said sixth transistor, said eighth transistor, said ninth transistor, said tenth transistor, and said eleventh transistor are NMOS transistors.

5. The bootstrapping circuit of claim 3, wherein said second transistor, said fifth transistor, said seventh transistor, and said twelfth transistor are PMOS transistors.

6. The bootstrapping circuit of claim 1, wherein a first clock signal on said first clock node is inverted relative to a second clock signal on said second clock node.

7. The bootstrapping circuit of claim 1, wherein said first transistor is a main switch of said bootstrapping circuit.

8. A bootstrapping circuit, comprising:

a first transistor coupled between an input node and an output node, wherein a gate of said first transistor is coupled to a first control node;

a second transistor having a first end coupled to said first control node, wherein a second end of said second transistor is coupled to a second control node;

a capacitor having a first end coupled to said second control node, wherein a second end of said capacitor is coupled to a third control node;

a first switching circuit, coupled to said first control node for connecting a ground node to said first control node;

a third transistor having a first end coupled to said input node, wherein a gate of said third transistor is coupled to said first control node, and wherein a second end of said third transistor is coupled to said third control node;

a second switching circuit, coupled to said second transistor for controlling said second transistor, wherein said second switching circuit is coupled to a first clock node;

a fourth transistor having a first end coupled to said third control node, wherein a gate of said fourth transistor is coupled to a second clock node, and wherein a second end of said fourth transistor is coupled to said ground node; and a fifth transistor having a first end coupled to said second control node, wherein a gate of said fifth transistor is coupled to said first control node, and wherein a second end of said fifth transistor is coupled to a source node.

9. The bootstrapping circuit of claim 8, wherein said first switching circuit comprises:

a sixth transistor having a first end coupled to said first control node, wherein a gate of said sixth transistor is coupled to said source node; and a seventh transistor having a first end coupled to a second end of said sixth transistor, wherein a gate of said seventh transistor is coupled to said second clock node, and wherein a second end of said seventh transistor is coupled to said ground node.

10. The bootstrapping circuit of claim 9, wherein said second switching circuit comprises:

an eighth transistor having a first end coupled to said third control node, wherein a gate of said eighth transistor is coupled to said first control node, and wherein a second end of said eighth transistor is coupled to a fourth control node;

a ninth transistor having a first end coupled to said third control node, wherein a gate of said ninth transistor is coupled to said first clock node, and wherein a second end of said ninth transistor is coupled to said fourth control node; and a tenth transistor having a first end coupled to said fourth control node, wherein a gate of said tenth transistor is coupled to said first clock node, and wherein a second end of said tenth transistor is coupled to said source node.

11. The bootstrapping circuit of claim 10, wherein said first transistor, said third transistor, said fourth transistor, said sixth transistor, said seventh transistor, said eighth transistor, and said ninth transistor are NMOS transistors.

12. The bootstrapping circuit of claim 10, wherein said second transistor, said fifth transistor, and said tenth transistor are PMOS transistors.

13. The bootstrapping circuit of claim 8, wherein a first clock signal on said first clock node is inverted relative to a second clock signal on said second clock node.

14. The bootstrapping circuit of claim 8, wherein said first transistor is a main switch of said bootstrapping circuit.

15. A bootstrapping circuit, comprising:

a first switching means coupled between an input node and an output node, wherein a gate of said first switching means is coupled to a first control node;

a second switching means having a first end coupled to said first control node, wherein a second end of said second switching means is coupled to a second control node;

a charge storing means having a first end coupled to said second control node, wherein a second end of said charge storing means is coupled to a third control node;

a first switching circuit means, coupled to said first control node for connecting a ground node to said first control node;

a third switching means having a first end coupled to said input node, wherein a gate of said third switching means is coupled to said first control node, and wherein a second end of said third switching means is coupled to said third control node;

a second switching circuit means, coupled to said second switching means for controlling said second switching means, wherein said second switching circuit means is coupled to a first clock node;

a fourth switching means having a first end coupled to said third control node, wherein a gate of said fourth switching means is coupled to a second clock node, and wherein a second end of said fourth switching means is coupled to said ground node;

a fifth switching means having a first end coupled to said second control node, wherein a gate of said fifth switching means is coupled to a fourth control node, and wherein a second end of said fifth switching means is coupled to a source node;

a sixth switching means having a first end coupled to said fourth control node, wherein a gate of said sixth switching means is coupled to said source node, and wherein a second end of said sixth switching means is coupled to said first clock node; and a seventh switching means having a first end coupled to said fourth control node, and wherein a second end of said seventh switching means is coupled to said second control node.

16. The bootstrapping circuit of claim 15, wherein said first switching circuit means comprises:

an eighth switching means having a first end coupled to said first control node, wherein a gate of said eighth switching means is coupled to said source node; and a ninth switching means having a first end coupled to a second end of said eighth switching means, wherein a gate of said ninth switching means is coupled to said second clock node, and wherein a second end of said ninth switching means is coupled to said ground node.

17. The bootstrapping circuit of claim 16, wherein said second switching circuit comprises:

a tenth switching means having a first end coupled to said third control node, wherein a gate of said tenth switching means is coupled to said first control node and wherein a second end of said tenth switching means is coupled to a fifth control node;

an eleventh switching means having a first end coupled to said third control node, wherein a gate of said eleventh switching means is coupled to said first clock node, and wherein a second end of said eleventh switching means is coupled to said fifth control node;

a twelfth switching means having a first end coupled to said fifth control node, wherein a gate of said twelfth switching means is coupled to said first clock node, and wherein a second end of said twelfth switching means is coupled to said source node; and wherein a gate of said seventh switching means is coupled to said fifth control node.

* * * * *